(12) United States Patent
Minamida et al.

(10) Patent No.: US 8,033,244 B2
(45) Date of Patent: Oct. 11, 2011

(54) SUBSTRATE PROCESSING SYSTEM

(75) Inventors: Junya Minamida, Koshi (JP); Seiki Ishida, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 478 days.

(21) Appl. No.: 12/336,711

(22) Filed: Dec. 17, 2008

(65) Prior Publication Data

US 2009/0151631 A1    Jun. 18, 2009

(30) Foreign Application Priority Data

Dec. 18, 2007  (JP) ................................ 2007-325718

(51) Int. Cl.
*B05C 11/02* (2006.01)
*B05C 5/00* (2006.01)
*B05C 11/00* (2006.01)

(52) U.S. Cl. .......... 118/692; 118/684; 118/52; 118/612; 118/326; 118/712

(58) Field of Classification Search ............... 118/52, 118/56, 612, 319, 320, 692, 712, 713, 684, 118/641–643, 666, 667, 693, 694, 688, 689, 118/326; 427/240; 396/604, 611, 627
See application file for complete search history.

(56) References Cited

U.S. PATENT DOCUMENTS

| 6,399,518 | B1 | 6/2002 | Ueda |
| 6,426,303 | B1 | 7/2002 | Ueda |
| 7,077,585 | B2 * | 7/2006 | Ito ................................ 396/611 |
| 2006/0237127 | A1 | 10/2006 | Inatomi |

FOREIGN PATENT DOCUMENTS

| JP | 2001-44119 | 2/2001 |
| JP | 2001-93827 | 4/2001 |
| JP | 2005-19969 | 1/2005 |
| JP | 2007-266333 | 10/2007 |

* cited by examiner

*Primary Examiner* — Yewebdar Tadesse
(74) *Attorney, Agent, or Firm* — Oblon, Spivak, McClelland, Maier & Neustadt, L.L.P.

(57) ABSTRACT

Leakage of an atmosphere of a solvent vapor used by a smoothing process for smoothing the surface of a resist pattern outside from a smoothing unit is prevented to facilitate incorporating the smoothing unit into a coating and developing system. A substrate processing system has a coating and developing block 20, a smoothing block 50, an airflow producing unit 60 for producing down airflow that flows down from above the coating and developing block 20 and the smoothing block 50, and a main controller 100 for controlling the airflow producing unit 60. The main controller 100 controls a flow regulating valve 64a placed in an air passage 63a connecting the airflow producing unit 60 to the coating and developing block 20 and a flow regulating valve 64b placed in an air passage 63b connecting the airflow producing unit 60 to the smoothing block 50 on the basis of a signal provided by a pressure sensor 65a for measuring the pressure in the coating and developing block 20 and a signal provided by a pressure sensor 65b for measuring the pressure in the smoothing block 50 such that the pressure in the smoothing block 50 is lower than that in the coating and developing block 20.

16 Claims, 7 Drawing Sheets

SUBSTRATE PROCESSING SYSTEM

BACKGROUND OF THE INVENTION

1. Field of the Invention

The present invention relates to a substrate processing system formed by incorporating a processing unit for improving the surface condition of a resist film formed on a substrate into a coating and developing system for processing a substrate, such as a semiconductor wafer.

2. Description of the Related Art

Usually, a photolithographic process among those for fabricating a semiconductor device includes, a resist film forming process for forming a resist film on a base film formed on, for example, a semiconductor wafer (hereinafter, referred to simply as "wafer") by applying a resist solution to the wafer, an exposure process for exposing the resist film through a mask provided with a circuit pattern to light to form a latent circuit pattern in the resist film, a developing process for processing the exposed resist film by a developer to form a resist pattern, and an etching process for etching the base film formed on the wafer by using the resist pattern as a mask.

A plurality of vertical and horizontal ridges and furrows are formed in the side surfaces of a resist pattern formed by the developing process due to the wave characteristic of the light used for irradiating the surface of the wafer by the exposure process. For example, the wavelengths of KrF light and ArF light are 248 nm and 193 nm, respectively. Those ridges and furrows are LWR lines (line width roughness lines) and LER lines (line edge roughness lines). When the resist pattern having surfaces roughened by the ridges and furrows are used for etching the base layer by the etching process, ridges and furrows corresponding to those of the resist pattern R are formed in the base film. Consequently, a precise circuit pattern cannot be formed and hence a semiconductor device of a desired quality cannot be produced.

The inventors of the present invention previously proposed a smoothing method (smoothing process) to improve the surface quality of a circuit pattern by smoothing LWR lines and LER lines in JP-A 2005-19969 (Claims and FIGS. 4, 5 and 16).

This smoothing process can smooth the surface of the resist pattern by evening the ridges and furrows formed in the surface of the resist pattern by discharging a solvent vapor onto the surface of the substrate provided with the resist pattern and processed by an exposure process and a developing process to swell the resist pattern.

To carry out the smoothing process, safety measures, such as sealing the smoothing unit, ventilating the processing unit and providing the smoothing unit with explosion-proof measures, need to be taken to prevent the solvent vapor from diffusing in the smoothing unit. An exhaust cup is placed in the smoothing unit to prevent the diffusion of the solvent vapor in the smoothing unit.

However, it is difficult to surely recover the solvent vapor discharged through the nozzle only by the exhaust cup and it is possible that the solvent vapor leaks into the smoothing unit. Therefore, the solvent vapor leaks out of the smoothing unit to contaminate the coating and developing system and the exposure system when the smoothing unit is incorporated into a coating and developing system. If the solvent vapor leaks outside, it is possible that the leaked solvent vapor gives detrimental effects to the human body.

SUMMARY OF THE INVENTION

The present invention has been made in view of the foregoing problems and it is therefore an object of the present invention to prevent the leakage of the atmosphere of the solvent vapor supplied into a smoothing unit outside the smoothing unit and to provide a substrate processing system facilitating the incorporation of the smoothing unit into a coating and developing system.

The present invention provides a substrate processing system including: a coating and developing block provided with a plurality of processing units for processing a substrate by a coating process for coating the substrate with a resist solution and a developing process; a substrate transfer block for carrying an unprocessed substrate from a cassette containing a plurality of substrates into the coating and developing block and returning a processed substrate into a cassette; an interface block for transferring a substrate between the coating and developing block and an exposure system; a smoothing block provided with a smoothing unit for smoothing the surface of a resist pattern formed on a substrate by processing the substrate by an exposure process and a developing process by exposing the surface of the resist pattern to a solvent vapor; an airflow producing means for producing down airflow that flows down from above the coating and developing block, the substrate transfer block, the interface block and the smoothing block; and a control means for controlling the airflow producing means; wherein the control means controls a first flow regulating valve placed in an air passage connecting the airflow producing means to the coating and developing block and a second flow regulating valve placed in an air passage connecting the airflow producing means to the smoothing unit on the basis of a signal provided by a first pressure sensor for measuring the pressure in the coating and developing block and a signal provided by a second pressure sensor for measuring the pressure in the smoothing block such that the pressure in the smoothing block is lower than that in the coating and developing block.

Possible solvent vapors may be those of acetone, propylene glycol monomethyl ether acetate (PGMEA), and N-methyl-2-pyrrolidone (NMP). A PGMEA vapor is suitable for processing a resist film irradiated with light having a wavelength of 248 nm emitted by KrF light source and a NMP vapor is suitable for processing a resist film irradiated with light having a wavelength of 193 nm emitted by an ArF light source.

Since the pressure in the smoothing block is lower than that in the coating and developing block, leakage of the atmosphere of the solvent vapor, namely, the solvent atmosphere, from the smoothing block into the coating and developing block can be prevented.

The control means of the substrate processing system of the present invention controls a third flow regulating valve placed in an air passage connecting the airflow producing means to the substrate transfer block and the second flow regulating valve on the basis of signals respectively provided by a third pressure sensor for measuring pressure in the substrate transfer block and the second pressure sensor such that the pressure in the smoothing block is lower than that in the substrate transfer block.

Since the pressure in the smoothing block is lower than that in the substrate transfer block, leakage of the atmosphere of the solvent vapor, namely, the solvent atmosphere, from the smoothing block into the substrate transfer block can be prevented.

In the substrate processing system of the present invention, a filter for removing the solvent atmosphere is disposed at a position on the lower exhaust side of the smoothing block, a leak detector is disposed downstream of the filter, and the control means controls a display means on the basis of a detection signal provided by the leak detector to display detected information by the display means.

Since the solvent atmosphere contained in a waste gas discharged from the smoothing block can be detected by the leak detector, and detected information can be displayed by the display means, the condition of the solvent atmosphere contained in the waste gas discharged from the smoothing block can be monitored.

In the substrate processing system of the present invention, the smoothing block is internally provided with a heat treatment unit for evaporating the solvent atmosphere adhering to the substrate processed by the smoothing process and a substrate carrying arm for transferring a substrate between the heat treatment unit and the smoothing unit.

The substrate carrying arm carries the substrate processed by the smoothing process to the heat treatment unit and the heat treatment unit evaporates the solvent atmosphere adhering to the substrate to prevent the substrate from carrying the solvent atmosphere and a solvent odor to other blocks.

In the substrate processing system of the present invention, the smoothing block is internally provided with an ultraviolet irradiation unit for irradiating the surface of a substrate with ultraviolet radiation to decompose a dissolution inhibiting protective group, such as a lactone group, and a substrate carrying arm for transferring a substrate between the ultraviolet irradiation unit and the smoothing unit.

The substrate carrying arm carries the substrate to the smoothing unit after the resist pattern formed on the substrate and processed by the developing process has been irradiated with ultraviolet radiation to decompose dissolution inhibiting protective groups in the resist pattern, and then the substrate is subjected to the smoothing process.

In the substrate processing system of the present invention, a solvent vapor supply means included in the smoothing unit includes a nozzle for spouting the solvent vapor onto a surface of a substrate, a tank containing the solvent for producing a solvent vapor, a gas source for supplying a gas into the tank to carry the solvent vapor by pressure, and a solvent vapor supply line connecting the tank and the nozzle, the tank is provided with a temperature sensor for measuring temperature in the tank and a level detector for detecting the level of a surface of the solvent contained in the tank, a gas flow regulating valve is placed in the gas supply line connecting the tank and the gas source, a flow regulating valve for regulating the flow of the solvent vapor is placed in the solvent vapor supply line, a gas concentration measuring device for measuring the solvent concentration of an atmosphere outside the processing unit of the smoothing block is disposed in the smoothing block, and the control means controls the gas flow regulating valve and the flow regulating valve for regulating the flow of the solvent vapor on the basis of signals provided by the gas concentration measuring device, the temperature sensor and the level detector and makes the display means display detected information.

The condition of the solvent vapor in the smoothing block can be monitored by the gas concentration measuring device and the flow of the solvent layer for the smoothing process can be properly controlled by controlling the gas flow regulating valve and the solvent vapor flow regulating valve on the basis of signals provided by the gas concentration measuring device, the temperature sensor and the level detector by the controller.

The substrate processing system of the present invention thus constituted have the following effects.

(1) Since the leakage of the atmosphere of the solvent vapor, namely, the solvent atmosphere, prevailing in the smoothing block into the coating and the developing block can be prevented, the coating and developing block and the exposure system connected to the coating and developing block can be prevented from being contaminated with the solvent atmosphere. Accordingly, the combination of the smoothing block with the coating and developing block can be facilitated.

(2) Since the leakage of the atmosphere of the solvent vapor, namely, the solvent atmosphere, prevailing in the smoothing block into the substrate transfer block can be prevented, the combination of the smoothing block with the coating and developing block can be facilitated and the reliability of the substrate processing system can be improved in addition to achieving the effect mentioned in (1)

(3) Since the condition of the solvent atmosphere contained in the waste gas discharged from the smoothing block can be monitored, the combination of the smoothing block with the coating and developing block is facilitated and the reliability of the substrate processing system can be improved in addition to achieving the effect mentioned in (1) and (2).

(4) The substrate is prevented from carrying the solvent atmosphere and a solvent odor into the other blocks in addition to achieving the effect mentioned in (1) to (3).

(5) Since the dissolution inhibiting protective groups in the resist pattern can be decomposed by irradiating the resist pattern formed on the surface of the substrate with ultraviolet radiation after the substrate has been processed by a developing process, the smoothing process can be completed in a short time and processing accuracy can be improved in addition to achieving the effect mentioned in (1) to (4).

(6) The condition of the solvent vapor in the smoothing block can be monitored by the gas concentration measuring device and the flow of the solvent vapor for the smoothing process can be properly controlled by controlling the gas flow regulating valve and the solvent vapor flow regulating valve on the basis of signals provided by the temperature sensor and the level detector by the control means in addition to achieving the effect mentioned in (1) to (5).

DESCRIPTION OF THE PREFERRED EMBODIMENTS

Preferred embodiments of the present invention will be described with reference to the accompanying drawings. A substrate processing system according to the present invention will be described as applied to a coating and developing system.

Figure 1:
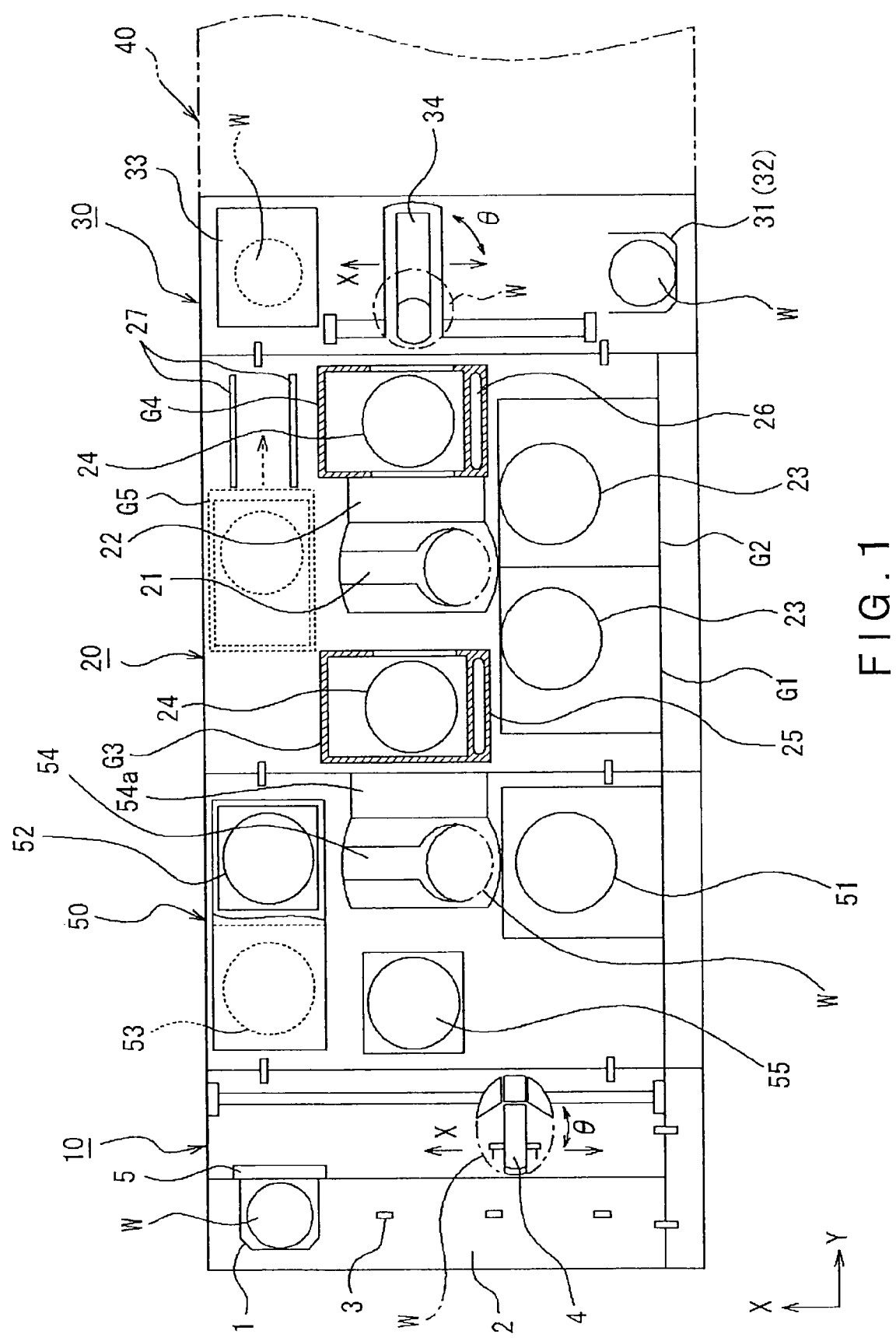
FIG. 1 is a schematic plan view of a coating and developing system to which a substrate processing system according to the present invention is applied.
Figure 2:
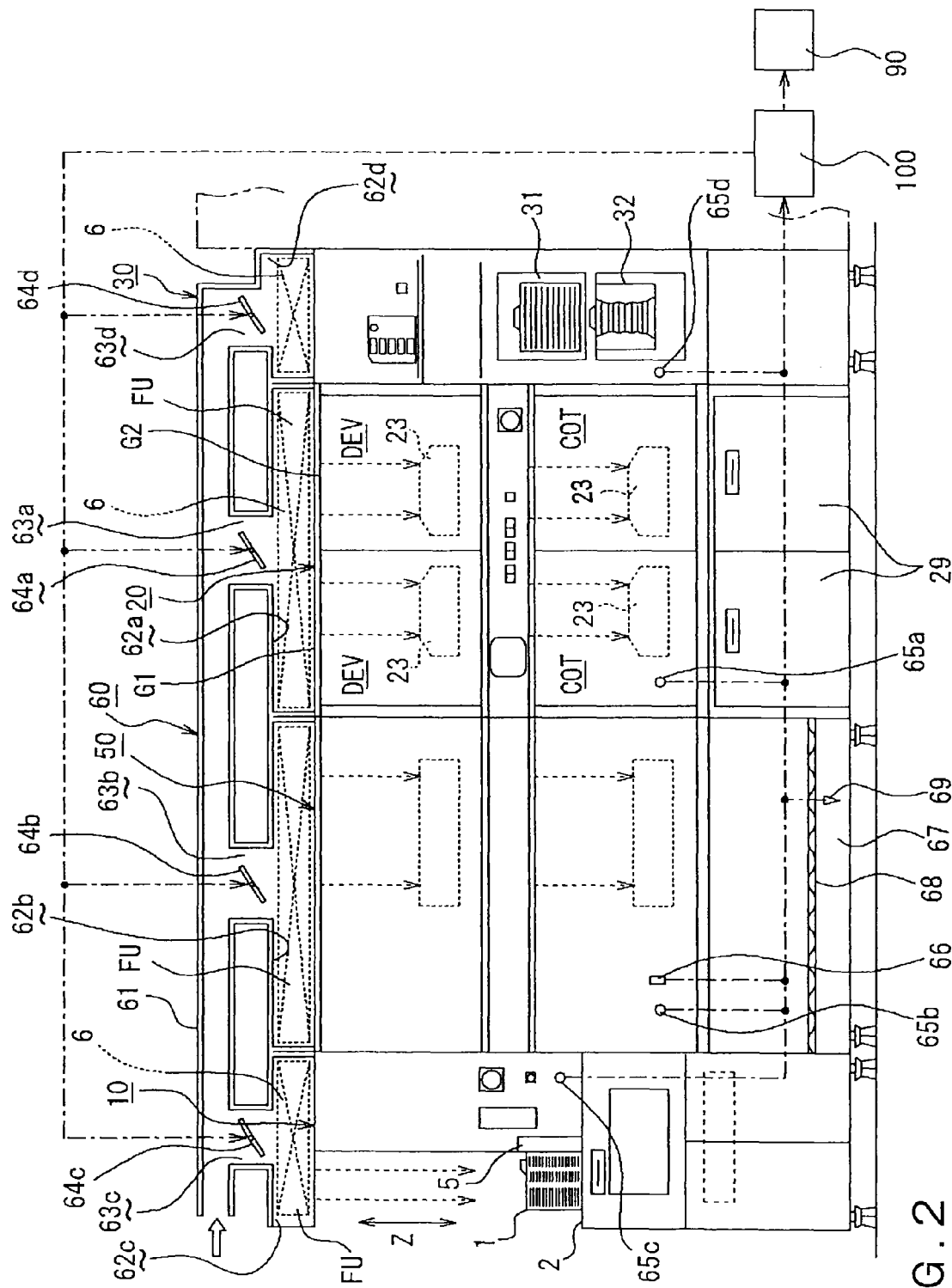
FIG. 2 is a schematic front elevation of the coating and developing system shown in FIG. 1.
Figure 3:
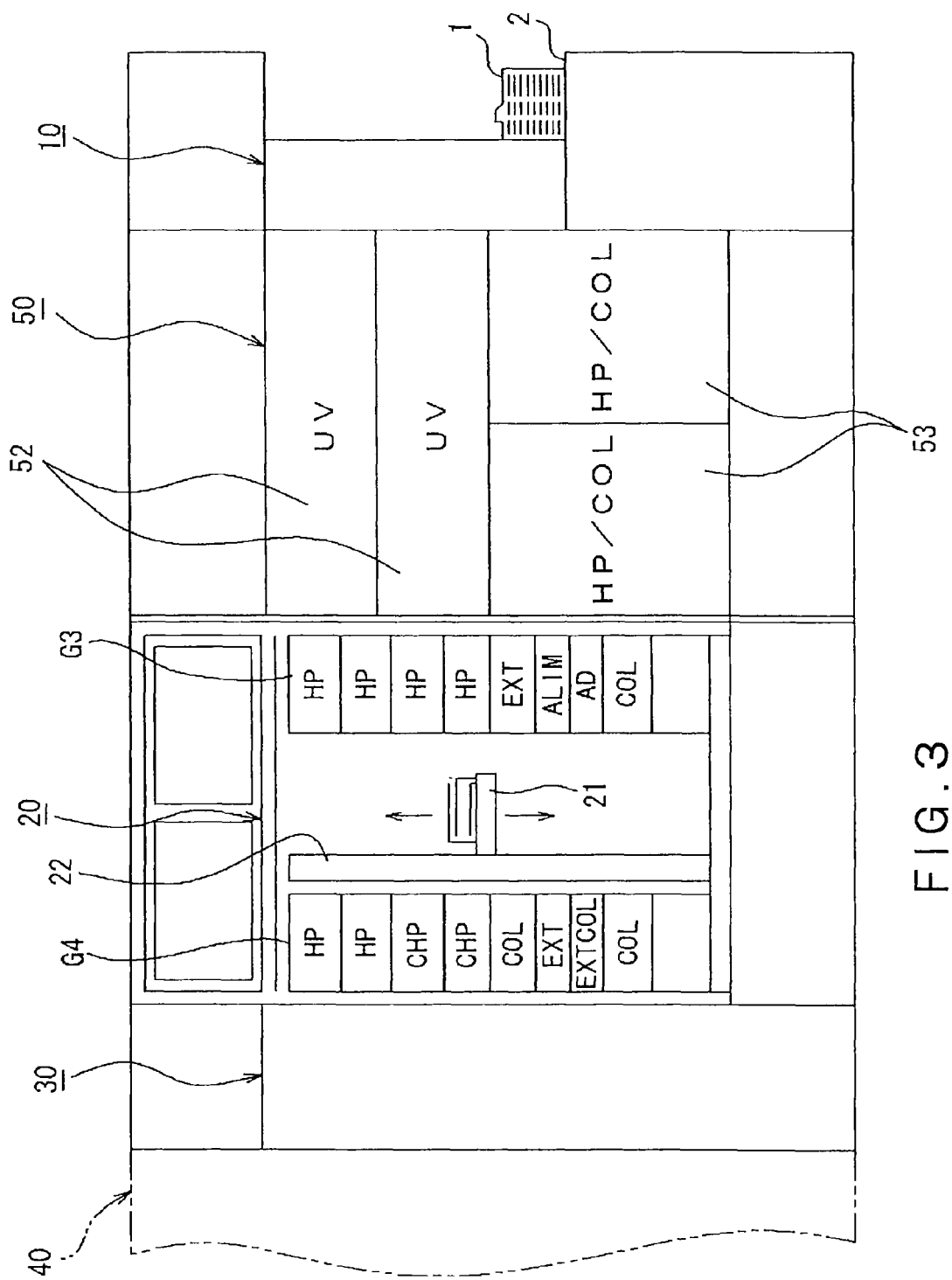
FIG. 3 is a schematic rear view of the coating and developing system shown in FIG. 1.

FIG. 1 is a schematic plan view of a coating and developing system in a preferred embodiment according to the present invention, FIG. 2 is a schematic front elevation of the coating and developing system shown in FIG. 1, and FIG. 3 is a schematic rear view of the coating and developing system shown in FIG. 1.

The coating and developing system includes, as principal components, a cassette station 10, namely a cassette transfer block, a coating and developing block 20 (hereinafter, referred to as "processing station 20"), an interface unit 30, namely, interface block, a smoothing block 50 interposed between the cassette station 10 and the processing station 20 and provided with a smoothing unit 51, an airflow producing unit 60, and a controller 100 for controlling the airflow producing unit 60. The cassette station 10 receives and sends out a wafer cassette 1 containing a plurality of semiconductor wafers W (hereinafter, referred to simply as "wafer(s) W"), namely, substrates to be processed, e.g., twenty-five wafers W, and takes out a wafer W from and delivers a wafer W to the cassette 1. The processing station includes various types of processing units disposed at predetermined positions in a layered arrangement for processing one wafer W at a time in a single-wafer processing mode. The interface unit 30 is interposed between the processing station 20 and an adjacent exposure system 40 to transfer a wafer W between the processing station 20 and the exposure system 40. The smoothing block 50 smoothes the surface of a resist pattern formed on a wafer W. The airflow producing unit 60 produces airflow that flows down from above the cassette station 10, the processing station 20, the interface unit 30 and the smoothing block 50.

Referring to FIG. 1, in the cassette station 10, a plurality of wafer cassettes 1, e.g., four wafer cassettes 1 at the most, are arranged horizontally in an X-direction at positions corresponding to protrusions 3 formed on a cassette table 2 with their open sides covered with a lid facing the processing station 20. Lid operating devices 5 are arranged opposite to the wafer cassettes 1, respectively. A wafer carrying arm 4 can move in the horizontal X-directions in which the wafer cassettes 1 are arranged and vertical Z-directions in which wafers W are arranged in layers in the wafer cassette 1, and can turn in a O-direction. The wafer carrying arm 4 can carry a wafer W to an alignment unit ALIM included in the smoothing block 50.

Referring to FIG. 1, a main wafer carrying arm 21 is installed in a central area of the processing station 20. The main wafer carrying arm 21 is moved vertically by a moving mechanism 22. All the processing units of one or a plurality of groups are arranged in a vertically layered arrangement and the groups are arranged around the main wafer carrying arm 21. In this embodiment, the processing station 20 has five groups, namely, a first group G1, a second group G2, a third group G3, a fourth group G4 and a fifth group G5. The first group G1 and the second group G2 are arranged in the front part of the coating and developing system, the third group G3 is disposed near the smoothing block 50, the fourth group G4 is disposed near the interface unit 30, and the fifth group G5 is disposed in a rear part of the of the coating and developing system.

Referring to FIG. 2, a coating unit COT and a developing unit DEV are stacked one on top of the other in two layers in each of the first group G1 and the second group G2. The coating unit COT processes a wafer W held by a spin chuck, not shown, by a predetermined process. The developing unit DEV develops a latent resist pattern formed in a resist film by pouring a developer on a wafer W from a developer pouring device, not shown disposed opposite to the wafer W in a processing cup 23, namely, a processing vessel 23.

Referring to FIG. 3, the third group G3 is formed by stacking up open type processing units that processes a wafer W held on a wafer support table 24 by predetermined processes, such as a cooling unit COL, an adhesion promoting unit AD, an alignment unit ALIM, an extension unit EXT and four hot plate units HP in that order in, for example, eight layers. The cooling unit COL cools a wafer W placed on a support table 24. The adhesion promoting unit AD processes a wafer W by an adhesion promoting process. The alignment unit ALIM sets a wafer W in correct alignment. The extension unit EXT receives and sends out a wafer W. The hot plate units HP process a wafer W by a heat-treatment process.

The fourth group G4 is formed by stacking up open type processing units, such as a cooling unit COL, an extension cooling unit EXTCOL, an extension unit EXT, a cooling unit COL, two chilling hot plate units CHP each provided with a heat-treatment device having a quenching function, and two hot plate units HP each provided with a heat-treatment device in that order in, for example, eight layers.

The cooling units COL and the extension cooling unit EXTCOL, which use a low processing temperature, are placed in lower layers and the hot plate units HP, the chilling hot plate units CHP and the adhesion promoting unit AD, which use a high processing temperature, are placed in upper layers to reduce thermal interference between those units. Naturally, those units may be arranged in any suitable arrangement other than that shown in FIG. 3.

Vertical ducts 25 and 26 are incorporated into side walls of the third group G3 and the fourth group G4, namely, open type processing units, adjacent to the first group G1 and the second group G2, namely, spinner type processing units, respectively, as shown in FIG. 1. Clean air produced by the airflow producing unit 60 flows down in the ducts 25 and 26. The spinner type processing units of the first group G1 and the second group G2 are isolated from heat generated by the open type processing units of the third group G3 and the fourth group G4 by the ducts 25 and 26.

The coating and developing system can include a fifth group G5 of processing units stacked up in layers disposed behind the main wafer carrying arm 21 as indicated by dotted lines in FIG. 1. The processing units of the fifth group G5 can move sideways as viewed from the main wafer carrying arm 21 along guide rails 27. A vacant space is formed behind the main wafer carrying arm 21 by moving the processing units of the fifth group G5 disposed behind the main wafer carrying arm 21 along the guide rails 27 to facilitate carrying out maintenance work for the main wafer carrying arm 21 from behind the main wafer carrying arm 21. A chemical unit 29 including tanks containing, for example, a resist solution, a developer and resist dissolving solvent, and pipes connected to those tanks is disposed in a lower part of the processing station 20.

The interface unit 30 has a dimension in the X-direction, namely, width, equal to that of the processing station 20 and a dimension in a direction perpendicular to the X-direction, namely, length, smaller than that of the processing unit 20. A portable pickup cassette 31 and a stationary buffer cassette 32 are disposed one on top of the other in a front part of the interface unit 30. An edge exposure device 33 for processing a peripheral part and an identification mark area on a wafer W is disposed in a rear part of the interface unit 30. A wafer carrying arm 34, namely, a carrying means, is disposed in a middle part of the interface unit 30. The wafer carrying arm 34 moves in the X-directions and the Z-directions to carry a wafer W from and to the pickup cassette 31, the buffer cassette 32 and the edge exposure device 33. The wafer carrying arm 34 can turn in the θ-direction to access the extension unit EXT of the fourth group G4 and a transfer stage, not shown, of the adjacent exposure system 40 to carry a wafer W from and to the extension unit EXT and the transfer stage.

The smoothing block 50 has a smoothing unit 51 for smoothing the surface of a resist pattern formed on a wafer W processed by exposure and developing processes by spouting a solvent vapor of a solvent in which a resist is soluble on the surface of the resist pattern, an ultraviolet irradiation unit 52 for irradiating the surface of the wafer W with ultraviolet radiation to decompose a dissolution inhibiting protective groups contained in the resist pattern formed on the wafer W, a heat treatment unit 53 for evaporating the solvent atmosphere adhering to the wafer processed by the smoothing process, and a wafer carrying arm 54, namely, substrate carrying arm, for carrying a wafer W between the smoothing unit 51 and the ultraviolet irradiation unit 52 or the heat treatment unit 53. The wafer carrying arm 54 can be moved in vertical Z-directions and horizontal X- and Y-directions by a carrying arm moving mechanism 54a. An alignment unit ALIM is disposed at a position on the side of the cassette station 10 in the smoothing block 50.

Figure 4:
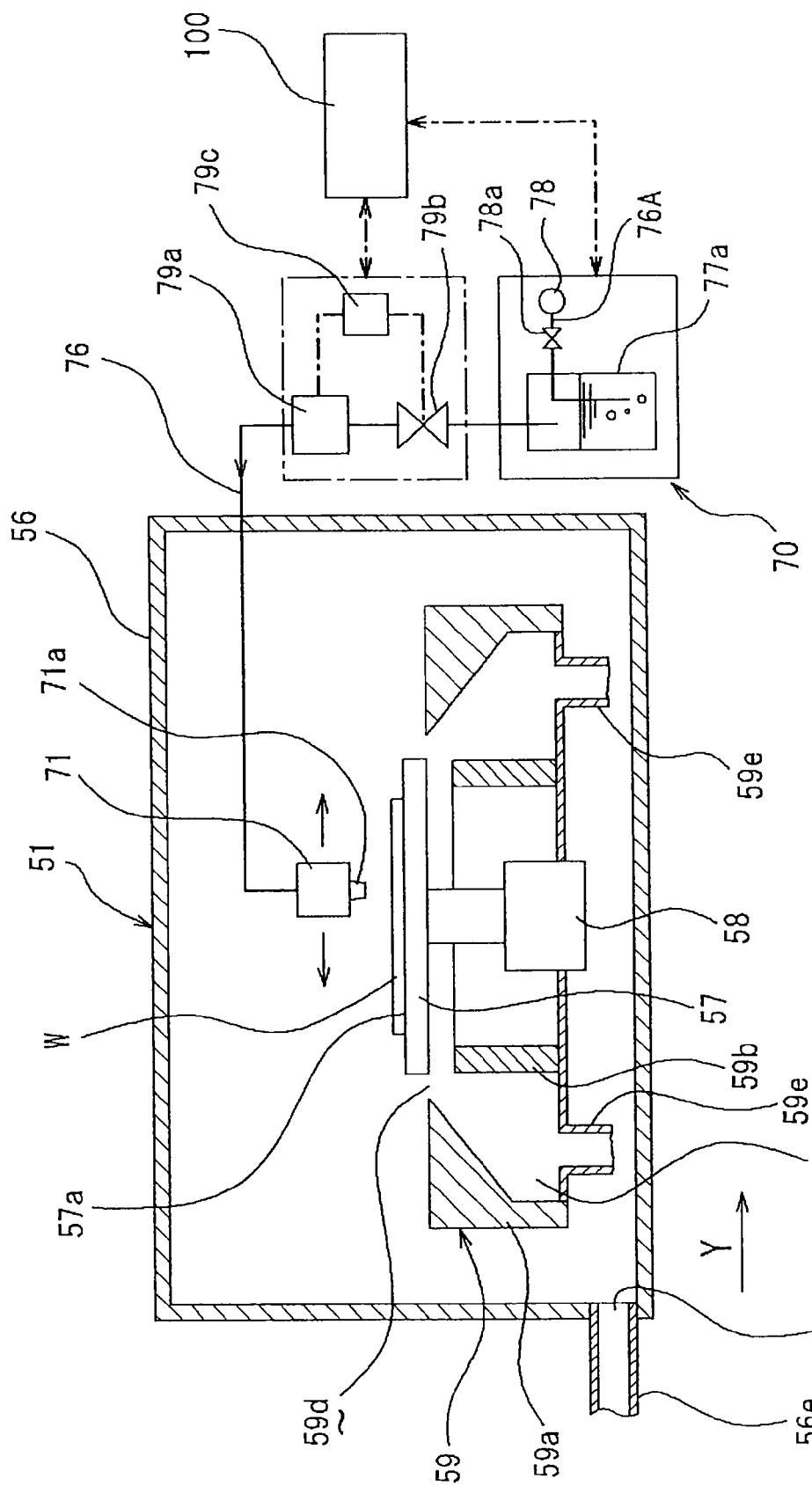
FIG. 4 is a schematic longitudinal sectional view of a smoothing unit according to the present invention.
Figure 5:
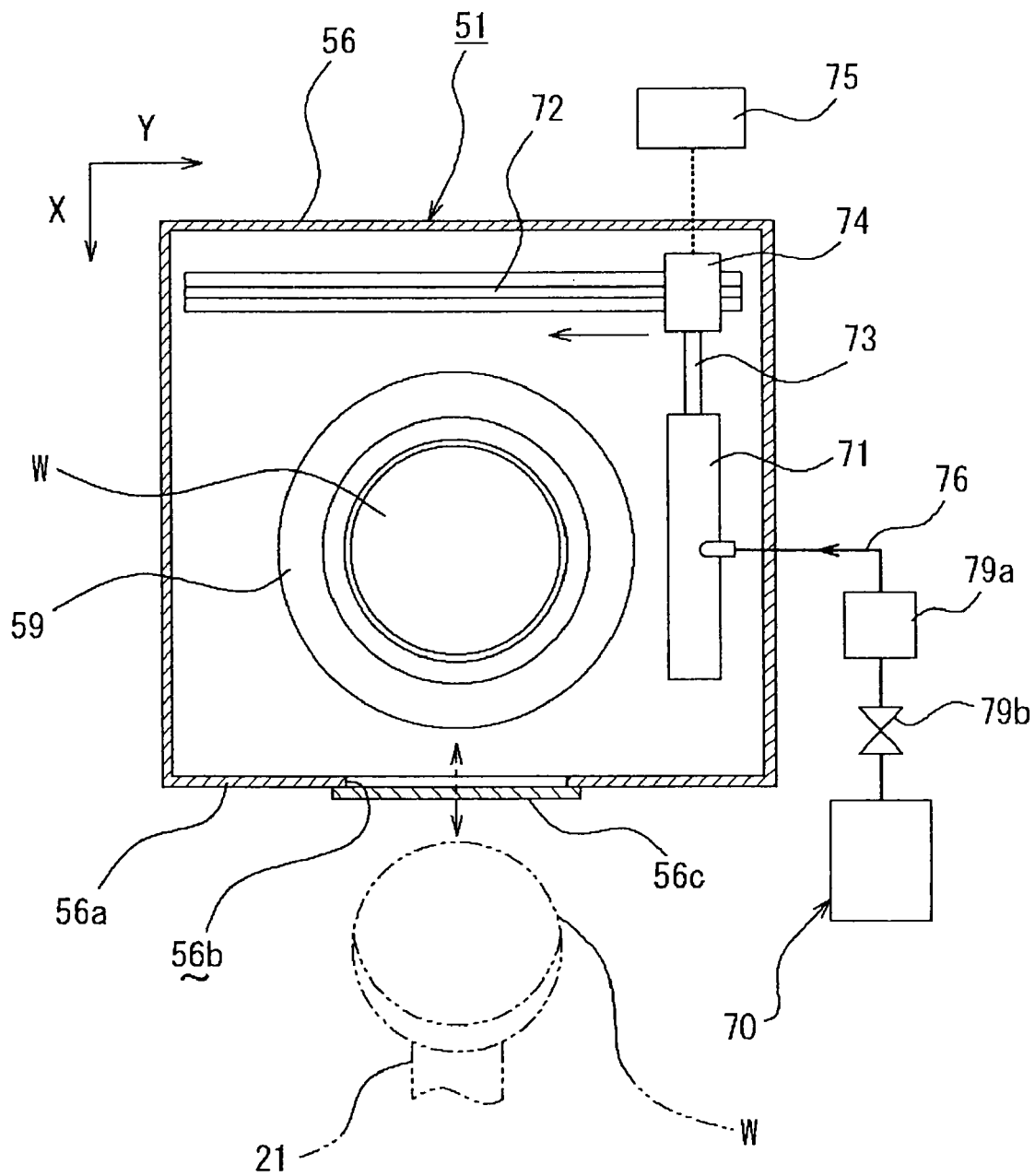
FIG. 5 is a schematic cross-sectional view of the smoothing unit shown in FIG. 4.

Referring to FIGS. 4 and 5, the smoothing unit 51 has a chuck 57 for holding a wafer W thereon installed in a central part of a box 56. An upper, circular holding surface 57a of the chuck 57 is horizontal and has a diameter approximately equal to that of a wafer W. The holding surface 57a of the chuck 51 is provided with a plurality of suction holes, not shown, to attract a wafer W to the holding surface 57a by suction. The chuck 57 is connected to a lifting device 58, such as a cylinder actuator. The lifting device 58 moves the holding surface 47a of the shuck 57 to transfer a wafer W between the chuck 47 and the wafer carrying arm 54.

An opening 56b is formed in one side wall of the box 56 to carry a wafer W into and to carry out a wafer W from the box 56. A shutter 56c is disposed at the opening 56b. The shutter 56c is operated by a shutter operating mechanism, not shown, to open and close the opening 56b. An exhaust port 56d is formed in a lower part of a side wall of the box 56 and is connected to an exhaust pump, not shown, by an exhaust pipe 56e.

The chuck 57 is surrounded by, for example, an exhaust cup 59. For example, the upper end of the exhaust cup 59 is at a level lower than that of the holding surface 57a of the chuck 57. For example, the exhaust cup 59 is a double-wall structure including an outer cup 59a and an inner cup 59b. The outer cup 59a and the inner cup 59b define an exhaust passage 59c. An annular suction opening 59d is formed between the respective upper ends of the outer cup 59a and the inner cup 59b. As shown in FIG. 4, the suction opening 59d surrounds the holding surface 57a. Parts of a space between the respective lower ends of the outer cup 59a and the inner cup 59b are connected to an exhaust system, not shown, by exhaust pipes 59e. An atmosphere over the chuck 57 is sucked through the suction opening 59d into the cup 59 and is removed from the cup 59.

Referring to FIG. 5, rails 72 are disposed on one side of the cup 59 (a side on the side of the negative X-direction, namely, the upper side as viewed in FIG. 5) so as to extend in a Y-direction, namely, a lateral direction in FIG. 5. The rails 72 are extended beyond the diametrically opposite ends of the cup 59. A drive unit 74 holding an arm 73 moves along the rails 72. A solvent vapor spouting nozzle 71 for spouting a solvent vapor on a wafer W (hereinafter, referred to simply as "solvent spouting nozzle 71") is held on the arms 73. The solvent spouting nozzle 71 can move along the rails 72 from a position outside one of the diametrically opposite ends of the cup 59 over the chuck 57 to a position outside the other of the diametrically opposite ends of the cup 59. For example, a drive unit controller 75 controls the drive unit 74 to control the movement of the solvent spouting nozzle 71. The drive unit controller 75 can move the solvent spouting nozzle 71 at a predetermined speed in the Y-directions. For example, the drive unit 74 is provided with a cylinder actuator for vertically moving the arm 73 to adjust the height of the solvent spouting nozzle 71 from the holding surface 57a. In this embodiment, the rails 72, the arm 73, the drive unit 74, and the drive unit controller 75 constitute a moving mechanism.

The solvent spouting nozzle 71 has an elongate shape having a length, for example, greater than the diameter of a wafer W and extending in the X-direction. The solvent spouting nozzle 71 is provided in its lower surface with a discharge part 71a extending longitudinally from one to the other end of the lower surface. The discharge part 71a is provided with a plurality of round discharge holes, not shown. arranged along the length of the solvent spouting nozzle 71. For example, a solvent vapor supply line 76 has one end connected to a solvent vapor source 70 and the other end connected to an upper part of the solvent spouting nozzle 71. A solvent vapor is supplied from above the solvent pouring nozzle 71, flows through the solvent pouring nozzle 71 and is discharged downward through the discharge holes so as to spread uniformly.

The solvent vapor source 70 has a storage tank 77a for producing a solvent vapor and storing a liquid solvent and connected, for example, to the solvent vapor supply line 76, and a nitrogen gas supply line 76A connected to a nitrogen gas source 78, namely, an inert gas source 78. Nitrogen gas ($N_2$) is supplied through the nitrogen gas supply line 76A into the storage tank 77a to supply the solvent vapor by pressure. The nitrogen gas supply pipe 76A is provided with a flow regulating valve 78a. Nitrogen gas is supplied through the nitrogen gas supply pipe 76A into the liquid solvent contained in the storage tank 77a to force a solvent vapor produced in the storage tank 77a into the solvent vapor supply line 76 by pressure. Thus the solvent vapor is supplied through the solvent vapor supply line 76 to the solvent spouting nozzle 71. The solvent may be, for example, acetone, propylene glycol monomethyl ether acetate (PGMEA) or N-methyl-2-pyrrolidone (NMP).

The solvent vapor supply line 76 is provided with a flow meter 79a for measuring the flow rate of the solvent vapor and a flow regulating valve 79b for regulating the flow of the solvent vapor. A flow rate measured by the flow meter 79a is given to a flow controller 79c. The flow controller 79c regulates the opening of the flow regulating valve 79b on the basis of the measured flow rate such that the solvent vapor is discharged through the solvent spouting nozzle 71 at a predetermined discharge rate. The flow controller 79c is electrically connected to a controller 100, namely, a control means. The flow controller 79c adjusts the flow of the solvent vapor on the basis of a control signal given thereto by the controller 100. The solvent vapor supply line 76 is provided with a temperature regulator 76a. The temperature regulator 76a maintains the solvent vapor to be supplied to the solvent spouting nozzle 71 at a fixed temperature.

A heater 80 for regulating temperature is incorporated into the side wall and the bottom wall of the storage tank 77a. A heating power source 81 supplies a current to the heater 80 to heat the heater 80 at a predetermined temperature. The storage tank 77a is provided with a temperature sensor 82 for measuring temperature in the storage tank 77a and a level detector 83 for detecting the level of the surface of the solvent contained in the storage tank 77a.

The temperature sensor 82, the level detector 83, the heating power source 81, the flow regulating valve 78a and the temperature regulator 76a are electrically connected to the controller 100. Signals provided by the temperature sensor 82 and the level detector 83 are given to the controller 100. The controller 100 gives control signals to the heating power source 81, the flow regulating valve 78a, the flow controller 79c and the temperature regulator 76a to control the heating power source 81, the flow regulating valve 78a, the flow controller 79c and the temperature regulator 76a.

The operation of the smoothing unit 51 will be described. A wafer W is placed and held on the holding surface 57a of the chuck 57. Then, the solvent spouting nozzle 71 is moved from a position outside the cup 59 to a position above a first end of the wafer W. For example, an operation for discharging the atmosphere in the cup 59 is stopped temporarily and the solvent spouting nozzle 71 starts spouting the solvent vapor at a fixed spouting rate. After the solvent vapor has been thus spouted on a predetermined area in the first end of the surface of the wafer W and the solvent spouting nozzle 71 has started spouting the solvent vapor, the solvent spouting nozzle 71 starts moving in the negative Y-direction toward a second end diametrically opposite the first end of the wafer W at a fixed speed. Thus, a solvent vapor supply area on the surface of the wafer W moves in the negative Y-direction toward the second end of the wafer W. Upon the arrival of the solvent spouting nozzle 71 at a position above the second end of the wafer W, the solvent spouting nozzle 71 starts moving from the second end toward the first end of the wafer W. Thus, the solvent spouting nozzle 71 goes and returns between the first and the second end of the wafer W to spout the solvent vapor on the surface of a resist pattern formed on the wafer W.

When the surface of the resist pattern is thus coated with the solvent vapor, the solvent vapor permeates the surface of the resist pattern. Then, the solvent vapor dissolves only a surface layer of the resist pattern and causes the surface layer of the resist pattern to swell. The moving speed of the solvent spouting nozzle 71, the spouting rate at which the solvent spouting nozzle 71 spouts the solvent vapor, the solvent concentration and the temperature of the solvent vapor are experimentally determined beforehand so that only the surface layer of the resist pattern may be dissolved.

Figure 6:
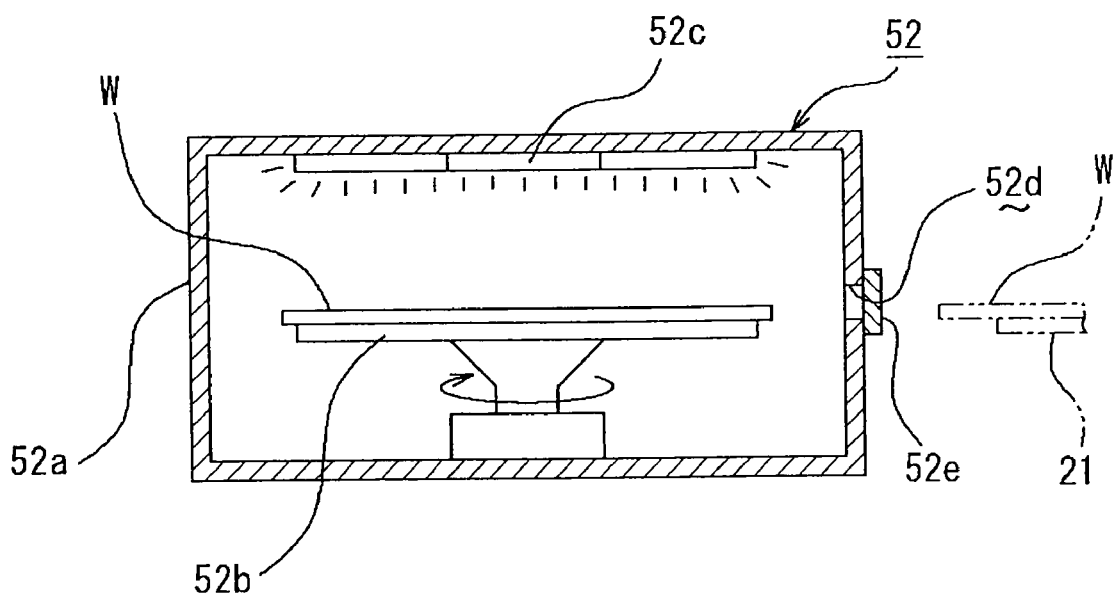
FIG. 6 is a schematic longitudinal sectional view of an ultraviolet irradiation unit according to the present invention.

Referring to FIG. 6, the ultraviolet irradiation unit 52 has a processing vessel 52a, a turntable 52b disposed in the processing vessel 52a, and an ultraviolet irradiation head 52c attached to the inner surface of the top wall of the processing vessel 52a. An opening 52d through which a wafer W is carried into and carried out from the processing vessel is formed in a side wall of the processing vessel 52a. A shutter 52e is disposed at the opening 52d. The shutter 52e is operated by a shutter operating mechanism, not shown, to open and close the opening 52d.

A wafer W is held on the turntable 52b of the ultraviolet irradiation unit 52, the turntable 52b holding the wafer W is rotated, the irradiation head 52c emits ultraviolet radiation to modify a film, such as a resist film formed on the wafer W by irradiating the film formed on the wafer W with the ultraviolet radiation. Thus, a dissolution inhibiting protective group can be decomposed. Since the wafer W is rotated during irradiation with the ultraviolet radiation, the wafer W can be uniformly irradiated with the ultraviolet radiation.

The resist pattern can be properly smoothed even if the resist pattern is formed by processing an ArF resist film by spouting the solvent vapor onto the resist pattern after the dissolution inhibiting group contained in the resist pattern formed on the wafer W has been thus decomposed. Since such a pretreatment process enables using a solvent, which has been ineffective in smoothing the resist pattern, for smoothing the resist pattern, a solvent selected from a large variety of solvents can be used. Since any one of a large variety of solvents can be used, a solvent for processing an ArF resist pattern can be chosen, which facilitates controlling shapes and such.

Figure 7:
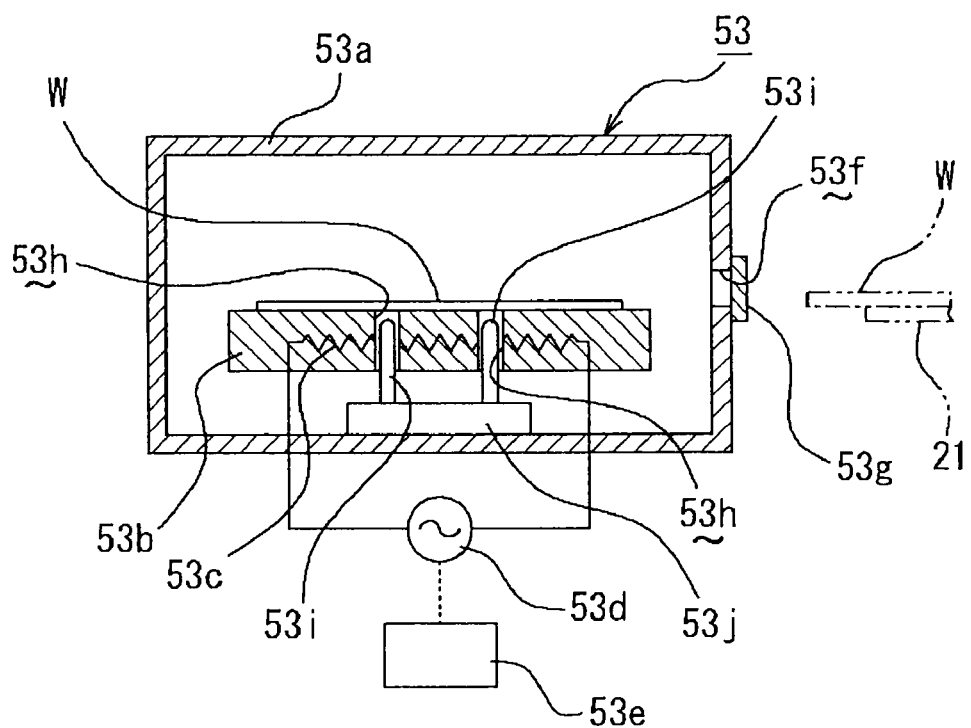
FIG. 7 is a schematic longitudinal sectional view of a het treatment unit according to the present invention.
Figure 8:
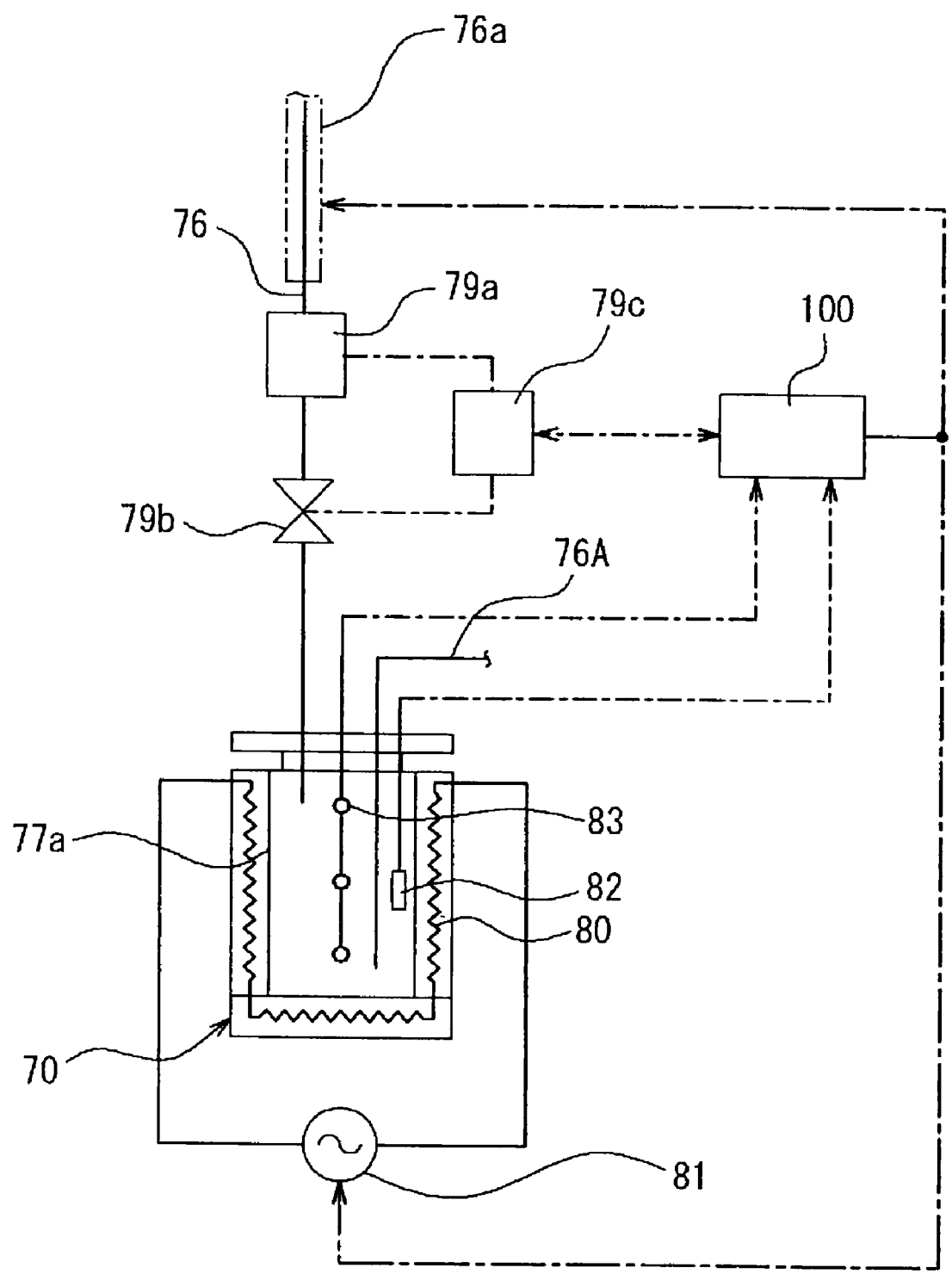
FIG. 8 is a schematic sectional view of a solvent vapor supply unit according to the present invention.

Referring to FIG. 7, the heat treatment unit 53 is provided with a heating plate 53b placed in a box 53a. The heating plate 53b heats a wafer W placed thereon. The heating plate 53b is internally provided with a heater 53c which generates heat when a current is supplied thereto. A power source 53d for supplying a current to the heater 53c is controlled by a heater controller 53e electrically connected to the main controller 100. The heater controller 53e can regulate the heat generating rate of the heater 53c on the basis of a control signal given thereto by the main controller 100 to control the temperature of the heating plate 53b. An opening 53f through which a wafer W is carried into and carried out from the box 53a is formed in a side wall of the box 53a. A shutter 53g is disposed at the opening 53f. The shutter 53g is operated by a shutter operating mechanism, not shown, to open and close the opening 53f.

Vertical through holes 53h are formed in a central part of the heating plate 53b, and lifting pins 53i are inserted in the through holes 53h from below. The lifting pins 53i are moved vertically by a lifting mechanism 53j so as to project upward from the surface of the heating plate 53b. Thus, the wafer W can be transferred between, for example, the wafer carrying arm 54 and the heating plate 53b by lifting up the wafer W by the lifting pins 53i.

Referring to FIG. 2, the airflow producing unit 60 is disposed horizontally on top of the cassette station 10, the smoothing block 50, the processing station 20 and the interface unit 30. The airflow producing unit 60 has a main duct 61 connected to an air supply mechanism, not shown. The main duct 61 communicates with a first air supply chamber 62a formed on the processing station 20, an air supply chamber 62b formed on the smoothing block 50, an air supply chamber 62c formed on the cassette station 10 and an air supply chamber 62d formed on the interface unit 30 by means of a first air passage 63a, a second air passage 63b, a third air passage 63c and a fourth air passage 63d, respectively. A first flow regulating valve 64a, a second flow regulating valve 64b, a third flow regulating valve 64c and a fourth flow regulating valve 64d are disposed, respectively, in the first air passage 63a, the second air passage 63b, the third air passage 63c and the fourth air passage 63d. The air supply chambers 62a, 62b, 62c and 62d are provided, respectively, with filter units FU each provided with a HEPA filter. The filter units FU cleans air supplied from the main duct 61 through the first flow regulating valve 64a, a second flow regulating valve 64b, a third flow regulating valve 64c and a fourth flow regulating 64d to supply clean air into the processing station 20, the smoothing block 50, the cassette station 10 and the interface unit 30 in a down-flow mode.

A first pressure sensor 65a, a second pressure sensor 65b, a third pressure sensor 65c and a fourth pressure sensor 65d are disposed, respectively, in the processing station 20, the smoothing block 50, the cassette station 10 and the interface unit 30. The pressure sensors 65a, 65b, 65c and 65d are electrically connected to the main controller 100. Signals provided by the pressure sensors 65a, 65b, 65c and 65d are given to the main controller 100. The respective openings of the first flow regulating valve 64a, the second flow regulating valve 64b, the third flow regulating valve 64c and the fourth flow regulating 64d are regulated on the basis of control signals provided by the main controller 100 to regulate the flow rates of air flowing into the processing station 20, the smoothing block 50, the cassette station 10 and the interface unit 30.

The flow rates of air are controlled such that the pressure in the smoothing block 50 is lower than that in the processing station 20. Since the pressure in the processing station is higher than that in the smoothing block 50, the flow of the solvent atmosphere created in the smoothing block 50 into the processing station 20 can be prevented to prevent the contamination of the processing units of the processing station 20, such as the coating units COT and the developing units DEV, with the solvent atmosphere. The flow of the solvent atmosphere through the processing station 20 into the exposure system 40 can be prevented and hence the exposure system 40 can be prevented from being contaminated with the solvent atmosphere.

The second flow regulating valve 64*b* and the third flow regulating valve 64*c* are regulated such that the pressure in the smoothing block 50 is lower than that in the cassette station 10. Since the pressure in the cassette station 10 is higher than that in the smoothing block 50, the flow of the solvent atmosphere created in the smoothing block 50 into the cassette station 10 can be prevented to prevent the contamination of the processing units of the cassette station 10 and wafers W held in the cassette station 10 with the solvent atmosphere.

A gas concentration measuring device 66 is placed in the smoothing block 50. The gas concentration measuring device 66 measures the solvent concentration of the solvent atmosphere in a space outside a processing unit included in the smoothing block 50. The gas concentration measuring device 66 is electrically connected to the main controller 100 to give a signal carrying a measured solvent concentration to the main controller 100. The heating power source 81 of the solvent vapor source 70, the flow regulating valve 78*a*, the flow controller 79 and the temperature regulator 76*a* are controlled on the basis of control signals provided by the main controller 100. Thus, the solvent concentration of the solvent vapor to be supplied into the smoothing unit 51 of the smoothing block 50 is adjusted to a predetermined solvent concentration.

A chemical filter 68 for removing the solvent atmosphere from the smoothing block 50 is disposed in an exhaust duct 67 disposed in a lower part of the smoothing block 50. A gas leak detector 69 is disposed on the downstream side of the chemical filter 68 and is electrically connected to the main controller 100. A leak detection signal provided by the gas leak detector 69 is given to the main controller 100. Upon the reception of the leak detection signal from the gas leak detector 69, the main controller 100 gives a control signal to a display 90 to make the display 90 display a warning message and sound the alarm.

The operation of the coating and developing system provided with the smoothing block 50 will be described.

In the cassette station 10, the lid operating device 5 opens the lid of a precedent wafer cassette 1 containing unprocessed wafers W. Then, the wafer carrying arm 4 accesses the wafer cassette 1 containing unprocessed wafers W and takes out one of the unprocessed wafer W from the wafer cassette 1. Then, the wafer carrying arm 4 carries the wafer W to the alignment unit ALIM of the smoothing block 50 and places the wafer W on the wafer table 55 of the alignment unit ALIM. The wafer W placed on the wafer table 55 is subjected to orientation flat location and centering. Subsequently, the wafer carrying 54 approaches the alignment unit ALIM from the opposite direction to receive the wafer W from the wafer table 55, carries the wafer W to the alignment unit ALIM of the third group G3 of the processing station 20 and places the wafer W on the wafer table 24 of the alignment unit ALIM. The wafer W placed on the wafer table 24 is subjected to orientation flat location and centering. Then, the main wafer carrying arm 21 accesses the alignment unit ALIM from the opposite direction and receives the wafer W from the wafer table 24.

In the processing station 20, the main wafer carrying arm 21 carries the wafer W first to the adhesion promoting unit AD of the third group G3. The adhesion promoting unit AD processes the wafer W by an adhesion promoting process. After the completion of the adhesion promoting process, the main wafer carrying arm 21 carries the wafer W from the adhesion promoting unit AD to the cooling unit COL of the third group G3 or the fourth group G4. The cooling unit COL cools down the wafer W at a set temperature at which the wafer W is to be cooled prior to the coating process, such as 23° C. After the wafer W has been properly cooled, the main wafer carrying arm 21 carries the wafer W from the cooling unit COL to the coating unit COT of the first group G1 or the second group G2. The coating unit COT processes the wafer W by a spin-coating process to coat a surface of the wafer W with a resist film of a uniform thickness.

After the completion of the coating process, the main wafer carrying arm 21 carries the wafer W from the coating unit COT to the hot plate unit HP and places the wafer W on a table in the hot plate unit HP. The hot plate unit HP processes the wafer W by a prebaking process which heats the wafer W at a predetermined temperature, such as 100° C., for a predetermined time to remove a solvent contained in the resist film. After the completion of the prebaking process, the main wafer carrying arm 21 carries the wafer W from the hot plate unit HP to the extension cooling unit EXTCOL of the fourth group G4. The extension cooling unit EXTCOL cools down the wafer W at a temperature suitable for the edge exposure process to be carried out by the edge exposure device 33, such as 24° C. After the wafer W has been properly cooled, the main wafer carrying arm 21 carries the wafer W to the extension unit EXT right above the extension cooling unit EXTCOL and places the wafer W on a table, not shown, disposed in the extension unit EXT. Then, the carrying arm 34 of the interface unit 30 accesses the extension unit EXT from the opposite direction and carries the wafer W from the extension unit EXT to the edge exposure device 33 of the interface unit 30. The edge exposure device 33 irradiates an unnecessary part of the resist film on a peripheral part of the surface of the wafer W with light for an edge exposure process.

After the completion of the edge exposure process, the carrying arm 34 carries out the wafer W from the box of the edge exposure device 33 and delivers the wafer W to the wafer receiving table, not shown, of the exposure system 40 adjacent to the interface unit 30.

The wafer W is returned to the wafer receiving table after the wafer W has been processed by an exposure process by the exposure system 40. Then, the carrying arm 34 of the interface unit 30 carries the wafer W from the wafer receiving table of the exposure system 40 to the extension unit EXT of the fourth group G4 of the processing station 20 and places the wafer on the wafer receiving table.

The main wafer carrying arm 21 carries the wafer W from the wafer receiving table to the chilling hot plate unit CHP. The chilling hot plate unit CHP processes the wafer W by a postexposurebaking process which heats the wafer W at, for example 120° C. for a predetermined time to prevent the formation of fringes or to induce the acid catalyst reaction of a chemically amplified resist (CAR). After the completion of the postexposurebaking process, the main wafer carrying arm 21 carries the wafer W from the chilling hot plate unit CHP to the cooling unit COL of the third group G3 or the fourth group G4. The cooling unit COL cools down the wafer at a set temperature at which the wafer W is to be cooled prior to the developing process, such as 23° C.

Subsequently, the wafer W is delivered to one of the developing units DEV of the first group G1 or the second group G2. The developing unit DEV wets the resist film on the surface of the wafer W uniformly with a developer to process the resist film by the developing process. Thus, a latent image of a predetermined circuit pattern formed in the resist film is developed in a circuit pattern, unnecessary parts of the resist film remaining on the wafer W are removed, and a part of the resist film corresponding to an alignment mark formed on the surface of the wafer W is removed. After the completion of the developing process, a rinsing liquid is poured onto the wafer W to rinse away the developer.

After the completion of the developing process, the main wafer carrying arm 21 carries out the wafer W from the developing unit DEV and places the wafer W on the wafer table 24 of the alignment unit ALIM. The wafer W placed on the wafer table 24 is subjected to orientation flat location and centering. Then, the wafer carrying arm 54 accesses the alignment unit ALIM from the opposite direction, receives the wafer W from the wafer table 24, carries the wafer W into the ultraviolet irradiation unit 52 of the smoothing block 50 and places the wafer W on the turntable 52b. The turntable 52b supporting the wafer W thereon is rotated and the ultraviolet irradiation head 52c irradiates the wafer W with ultraviolet radiation to modify the resist pattern formed on the surface of the wafer W and to decompose the dissolution inhibiting protective group.

After the wafer W has been irradiated with ultraviolet radiation by the ultraviolet irradiation unit 52, the wafer carrying arm 54 carries out the wafer W from the ultraviolet irradiation unit 52 to the smoothing unit 51. In the smoothing unit 51, the wafer W is held on the holding surface 57a of the chuck 57. Then, the solvent spouting nozzle 71 goes and returns over the wafer W and spouts the solvent vapor on the surface of the resist pattern formed on the wafer W to smooth the irregular surface of the resist pattern by making the resist patter swell.

After the wafer W has been processed by the smoothing process by the smoothing unit 51, the wafer carrying arm 54 carries out the wafer W from the smoothing unit 51 and delivers the wafer W to the heat treatment unit 53. The wafer W is placed on the heating plate 53b, the heater 53b built in the heating plate 53b is energized to heat the wafer W at, for example, 100° C. for a predetermined time for heat treatment. Consequently, the resist pattern swollen by the developing process is hardened and the chemical resistance of the resist pattern is improved.

After the solvent adhering to the wafer W has been evaporated by the heat treatment unit 53, the wafer carrying arm 54 carries out the wafer W from the heat treatment unit 53 and places the wafer W on the wafer table 55 of the alignment unit ALIM on the side of the cassette station 10. The wafer W placed on the wafer table 55 is subjected to orientation flat location and centering. Then, the wafer carrying arm 4 accesses the alignment unit ALIM from the opposite direction and receives the wafer W from the wafer table 55. Then, the wafer carrying arm 4 put the thus processed wafer W into a predetermined slot in a wafer cassette 1 for containing processed wafers W. After the wafer cassette 1 has been fully loaded with processed wafers W, the lid operating device 5 put the lid on the wafer cassette 1. Thus, a wafer processing procedure is completed.

Although the smoothing unit 51 are stacked in a vertical arrangement in the smoothing block 50 in the foregoing embodiment, the smoothing units 51 may be arranged in any optional arrangement. For example, the smoothing units 51 may be arranged horizontally. The ultraviolet irradiation units 52 and the heat treatment units 53 may be arranged in any optional arrangement; that is, those units may be arranged either vertically or horizontally as the occasion demands.

Although the smoothing block 50 is interposed between the cassette station 10 and the processing station 20 in the foregoing embodiment, the smoothing block 50 may be connected to the cassette station 10 so as to extend perpendicularly to the cassette station 10 and the processing station in a horizontal plane.

What is claimed is:

1. A substrate processing system comprising:
   a coating and developing block provided with a plurality of processing units for processing a substrate by a coating process for coating the substrate with a resist solution and a developing process;
   a substrate transfer block for carrying an unprocessed substrate from a cassette containing a plurality of substrates into the coating and developing block and returning a processed substrate into a cassette;
   an interface block for transferring a substrate between the coating and developing block and an exposure system;
   a smoothing block provided with a smoothing unit for smoothing a surface of a resist pattern formed on a substrate by processing the substrate by an exposure process and a developing process by exposing the surface of the resist pattern to a solvent vapor;
   an airflow producing means for producing down airflow that flows down from above the coating and developing block, the substrate transfer block, the interface block and the smoothing block; and
   a control means for controlling the airflow producing means;
   wherein the control means is configured to control a first flow regulating valve placed in an air passage connecting the airflow producing means to the coating and developing block and a second flow regulating valve placed in an air passage connecting the airflow producing means to the smoothing unit on the basis of a signal provided by a first pressure sensor for measuring pressure in the coating and developing block and a signal provided by a second pressure sensor for measuring pressure in the smoothing block such that the pressure in the smoothing block is lower than that in the coating and developing block.

2. The substrate processing system according to claim 1, wherein the control means controls a third flow regulating valve placed in an air passage connecting the airflow producing means to the substrate transfer block and the second flow regulating valve on the basis of signals respectively provided by a third pressure sensor for measuring pressure in the substrate transfer block and the second pressure sensor such that the pressure in the smoothing block is lower than that in the substrate transfer block.

3. The substrate processing system according to claim 2, wherein the smoothing block is internally provided with a heat treatment unit for evaporating solvent atmosphere adhering to the substrate processed by the smoothing process and a substrate carrying arm for transferring a substrate between the heat treatment unit and the smoothing unit.

4. The substrate processing system according to claim 2, wherein the smoothing block is internally provided with an ultraviolet irradiation unit for irradiating a surface of a substrate with ultraviolet radiation to decompose a dissolution inhibiting protective group and a substrate carrying arm for transferring a substrate between the ultraviolet irradiation unit and the smoothing unit.

5. The substrate processing system according to claim 2, wherein a solvent vapor supply means included in the smoothing unit includes a nozzle for spouting solvent vapor onto a surface of a substrate, a tank containing a solvent for producing the solvent vapor, a gas source for supplying a gas into the tank to carry the solvent vapor by pressure, and a solvent vapor supply line connecting the tank and the nozzle, the tank is provided with a temperature sensor for measuring temperature in the tank and a level detector for detecting a level of a surface of the solvent contained in the tank, a gas flow regulating valve is placed in the gas supply line connecting the tank and the gas source, a flow regulating valve for regulating flow of the solvent vapor is placed in the solvent vapor supply line, a gas concentration measuring device for measuring solvent concentration of an atmosphere outside the processing unit of the smoothing block is disposed in the smoothing block, and the control means controls the gas flow regulating valve and the flow regulating valve for regulating the flow of the solvent vapor on the basis of signals provided by the gas concentration measuring device, the temperature sensor and the level detector and makes a display means display detected information.

6. The substrate processing system according to claim 2, wherein a filter for removing the solvent atmosphere is disposed at a position on a lower exhaust side of the smoothing block, a leak detector is disposed downstream of the filter, and the control means controls a display means on the basis of a detection signal provided by the leak detector to display detected information by the display means.

7. The substrate processing system according to claim 6, wherein the smoothing block is internally provided with an ultraviolet irradiation unit for irradiating a surface of a substrate with ultraviolet radiation to decompose a dissolution inhibiting protective group and a substrate carrying arm for transferring a substrate between the ultraviolet irradiation unit and the smoothing unit.

8. The substrate processing system according to claim 6, wherein a solvent vapor supply means included in the smoothing unit includes a nozzle for spouting solvent vapor onto a surface of a substrate, a tank containing a solvent for producing the solvent vapor, a gas source for supplying a gas into the tank to carry the solvent vapor by pressure, and a solvent vapor supply line connecting the tank and the nozzle, the tank is provided with a temperature sensor for measuring temperature in the tank and a level detector for detecting a level of a surface of the solvent contained in the tank, a gas flow regulating valve is placed in the gas supply line connecting the tank and the gas source, a flow regulating valve for regulating flow of the solvent vapor is placed in the solvent vapor supply line, a gas concentration measuring device for measuring solvent concentration of an atmosphere outside the processing unit of the smoothing block is disposed in the smoothing block, and the control means controls the gas flow regulating valve and the flow regulating valve for regulating the flow of the solvent vapor on the basis of signals provided by the gas concentration measuring device, the temperature sensor and the level detector and makes the display means display detected information.

9. The substrate processing system according to claim 6, wherein the smoothing block is internally provided with a heat treatment unit for evaporating solvent atmosphere adhering to the substrate processed by the smoothing process and a substrate carrying arm for transferring a substrate between the heat treatment unit and the smoothing unit.

10. The substrate processing system according to claim 9, wherein the smoothing block is internally provided with an ultraviolet irradiation unit for irradiating a surface of a substrate with ultraviolet radiation to decompose a dissolution inhibiting protective group and a substrate carrying arm for transferring a substrate between the ultraviolet irradiation unit and the smoothing unit.

11. The substrate processing system according to claim 10, wherein a solvent vapor supply means included in the smoothing unit includes a nozzle for spouting solvent vapor onto a surface of a substrate, a tank containing a solvent for producing the solvent vapor, a gas source for supplying a gas into the tank to carry the solvent vapor by pressure, and a solvent vapor supply line connecting the tank and the nozzle, the tank is provided with a temperature sensor for measuring temperature in the tank and a level detector for detecting a level of a surface of the solvent contained in the tank, a gas flow regulating valve is placed in the gas supply line connecting the tank and the gas source, a flow regulating valve for regulating flow of the solvent vapor is placed in the solvent vapor supply line, a gas concentration measuring device for measuring solvent concentration of an atmosphere outside the processing unit of the smoothing block is disposed in the smoothing block, and the control means controls the gas flow regulating valve and the flow regulating valve for regulating the flow of the solvent vapor on the basis of signals provided by the gas concentration measuring device, the temperature sensor and the level detector and makes the display means display detected information.

12. The substrate processing system according to claim 9, wherein a solvent vapor supply means included in the smoothing unit includes a nozzle for spouting solvent vapor onto a surface of a substrate, a tank containing a solvent for producing the solvent vapor, a gas source for supplying a gas into the tank to carry the solvent vapor by pressure, and a solvent vapor supply line connecting the tank and the nozzle, the tank is provided with a temperature sensor for measuring temperature in the tank and a level detector for detecting a level of a surface of the solvent contained in the tank, a gas flow regulating valve is placed in the gas supply line connecting the tank and the gas source, a flow regulating valve for regulating flow of the solvent vapor is placed in the solvent vapor supply line, a gas concentration measuring device for measuring solvent concentration of an atmosphere outside the processing unit of the smoothing block is disposed in the smoothing block, and the control means controls the gas flow regulating valve and the flow regulating valve for regulating the flow of the solvent vapor on the basis of signals provided by the gas concentration measuring device, the temperature sensor and the level detector and makes the display means display detected information.

13. The substrate processing system according to claim 1, wherein a filter for removing the solvent atmosphere is disposed at a position on the lower exhaust side of the smoothing block, a leak detector is disposed downstream of the filter, and the control means controls a display means on the basis of a detection signal provided by the leak detector to display detected information by the display means.

14. The substrate processing system according to claim 1, wherein the smoothing block is internally provided with a heat treatment unit for evaporating solvent atmosphere adhering to the substrate processed by the smoothing process and a substrate carrying arm for transferring a substrate between the heat treatment unit and the smoothing unit.

15. The substrate processing system according to claim 1, wherein the smoothing block is internally provided with an ultraviolet irradiation unit for irradiating a surface of a substrate with ultraviolet radiation to decompose a dissolution inhibiting protective group and a substrate carrying arm for transferring a substrate between the ultraviolet irradiation unit and the smoothing unit.

16. The substrate processing system according to claim 1, wherein a solvent vapor supply means included in the smoothing unit includes a nozzle for spouting solvent vapor onto a surface of a substrate, a tank containing a solvent for producing the solvent vapor, a gas source for supplying a gas into the tank to carry the solvent vapor by pressure, and a solvent vapor supply line connecting the tank and the nozzle, the tank is provided with a temperature sensor for measuring temperature in the tank and a level detector for detecting a level of a surface of the solvent contained in the tank, a gas flow regulating valve is placed in the gas supply line connecting the tank and the gas source, a flow regulating valve for regulating flow of the solvent vapor is placed in the solvent vapor supply line, a gas concentration measuring device for measuring solvent concentration of an atmosphere outside the processing unit of the smoothing block is disposed in the smoothing block, and the control means controls the gas flow regulating valve and the flow regulating valve for regulating the flow of the solvent vapor on the basis of signals provided by the gas concentration measuring device, the temperature sensor and the level detector and makes a display means display detected information.

* * * * *